(12) United States Patent
Aoyagi

(10) Patent No.: US 6,911,721 B2
(45) Date of Patent: Jun. 28, 2005

(54) SEMICONDUCTOR DEVICE, METHOD FOR MANUFACTURING SEMICONDUCTOR DEVICE AND ELECTRONIC EQUIPMENT

(75) Inventor: Akiyoshi Aoyagi, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/647,075

(22) Filed: Aug. 21, 2003

(65) Prior Publication Data

US 2004/0094831 A1 May 20, 2004

(30) Foreign Application Priority Data

Aug. 28, 2002 (JP) ........................................ 2002-248867

(51) Int. Cl.⁷ .............................................. H01L 23/02
(52) U.S. Cl. .................... 257/678; 257/685; 257/686; 257/786; 257/723; 257/696; 257/777; 257/684; 257/690; 257/700; 257/709; 257/731; 257/736; 257/776; 438/106
(58) Field of Search .................. 257/684, 690, 257/700, 709, 731, 736, 678, 685, 666, 786, 723, 696, 777

(56) References Cited

U.S. PATENT DOCUMENTS 5,229,960 A * 7/1993 De Givry ..................... 365/63
6,084,294 A * 7/2000 Tomita ........................ 257/686
6,383,840 B1 * 5/2002 Hashimoto ................... 438/109
6,462,412 B2 * 10/2002 Kamei et al. ................ 257/723

* cited by examiner

*Primary Examiner*—Eddie Lee
*Assistant Examiner*—Junghwa Im
(74) *Attorney, Agent, or Firm*—Hogan & Hartson, LLP

(57) ABSTRACT

A semiconductor device includes a base substrate provided with a base wiring. A first substrate includes a first wiring to be electrically connected to the base wiring and is provided above the base substrate. A first semiconductor element includes a first electrode to be electrically connected to the first wiring and is provided between the base substrate and the first substrate. A second substrate includes a second wiring to be electrically connected to the base wiring and is provided above the first substrate. A second semiconductor element includes a second electrode to be electrically connected to the second wiring and is provided between the first substrate and the second substrate and above the first semiconductor element. The first substrate has a first region where the first semiconductor element is provided below, a second region where a portion of the first wiring that connects to the base wiring is located, and a first bent section between the first region and the second region. The second substrate has a third region where the second semiconductor element is provided below, a fourth region where a portion of the second wiring that connects to the base wiring is located, and a second bent section between the third region and the fourth region.

7 Claims, 5 Drawing Sheets

SEMICONDUCTOR DEVICE, METHOD FOR MANUFACTURING SEMICONDUCTOR DEVICE AND ELECTRONIC EQUIPMENT

BACKGROUND OF THE INVENTION

1. Field of the Invention

The present invention relates to semiconductor devices, methods for manufacturing semiconductor devices, and electronic equipment.

2. Description of Related Art

According to a technology that is known to achieve higher density and larger capacity in semiconductor elements, substrates with semiconductor elements mounted thereon are stacked in layers in a thickness direction and are electrically connected to one another to make them conductive with one another.

For example, conventionally there is a method in which substrates with through holes formed therein are used, and conductive members are provided in the through holes to make the upper and lower layers conductive with one another. To make the upper and lower layers conductive through the conductive members in the substrates, solder balls, bumps, pins and the like may be provided between the substrates.

However, according to the conventional technology described above, when a plurality of substrates with semiconductor elements mounted thereon are to be stacked in layers, the thickness of each of the substrates, the thickness of conduction means and margins between the semiconductor elements and substrates are added up. As a result, this causes a problems that the package size becomes large. Also, when different types of semiconductor elements are mounted, for example, through holes for chip selectors that are to be provided independently from others may be required, and the package size may become larger by the amount for the through holes, or the degree of freedom in designing wirings becomes lower. In this case, other substrates may additionally be used. However, this also leads to a large package size.

The present invention has been made in view of the circumstances described above, and an advantage is to provide semiconductor devices, methods for manufacturing semiconductor devices, and electronic equipment, which can reduce the package size.

SUMMARY OF THE INVENTION

A semiconductor device in accordance with the present invention includes a base substrate provided with a base wiring. A first substrate includes a first wiring to be electrically connected to the base wiring and is provided above the base substrate. A first semiconductor element includes a first electrode to be electrically connected to the first wiring and is provided between the base substrate and the first substrate. A second substrate includes a second wiring to be electrically connected to the base wiring and is provided above the first substrate. A second semiconductor element includes a second electrode to be electrically connected to the second wiring and is provided between the first substrate and the second substrate and above the first semiconductor element. The first substrate has a first region where the first semiconductor element is provided below, a second region where a portion of the first wiring connects to the base wiring is located, and a first bent section between the first region and the second region. The second substrate has a third region where the second semiconductor element is provided below, a fourth region where a portion of the second wiring that connects to the base wiring is located, and a second bent section between the third region and the fourth region.

A method for manufacturing a semiconductor device in accordance with the present invention includes mounting a first semiconductor element having a first electrode on a first substrate having a first wiring with the first electrode being electrically connected to the first wiring, disposing the first substrate above a base substrate provided with a base wiring with a surface side of the first substrate on which the first semiconductor device is mounted being opposed to the base substrate, providing a first bent section in the first substrate and electrically connecting the first wiring to the base wiring. The method also includes mounting a second semiconductor element having a second electrode on a second substrate having a second wiring with the second electrode being electrically connected to the second wiring, disposing the second substrate above the first substrate with a surface side of the second substrate on which the second semiconductor device is mounted being opposed to the first substrate, providing a second bent section in the second substrate, and electrically connecting the second wiring to the base wiring.

DETAILED DESCRIPTION OF THE PREFERRED EMBODIMENTS

Hereunder, embodiments of the present invention will be described.

Figure 1:
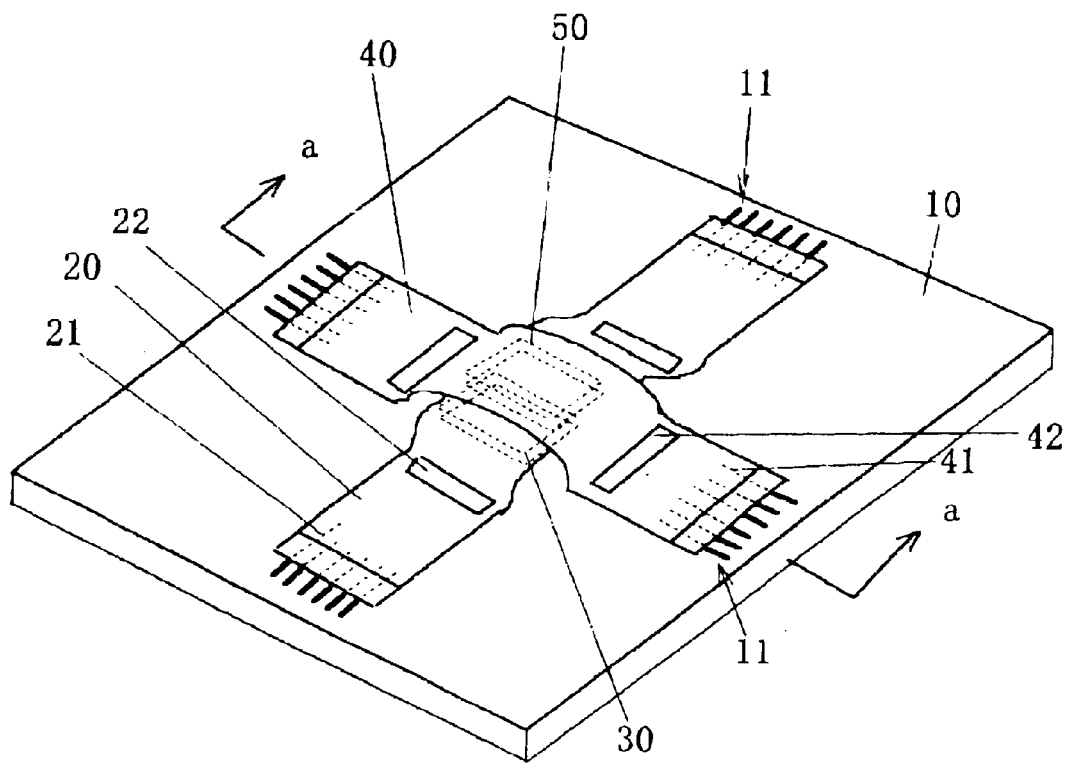
FIG. 1 shows a diagram of a semiconductor device in accordance with one embodiment of the present invention.
Figure 2:
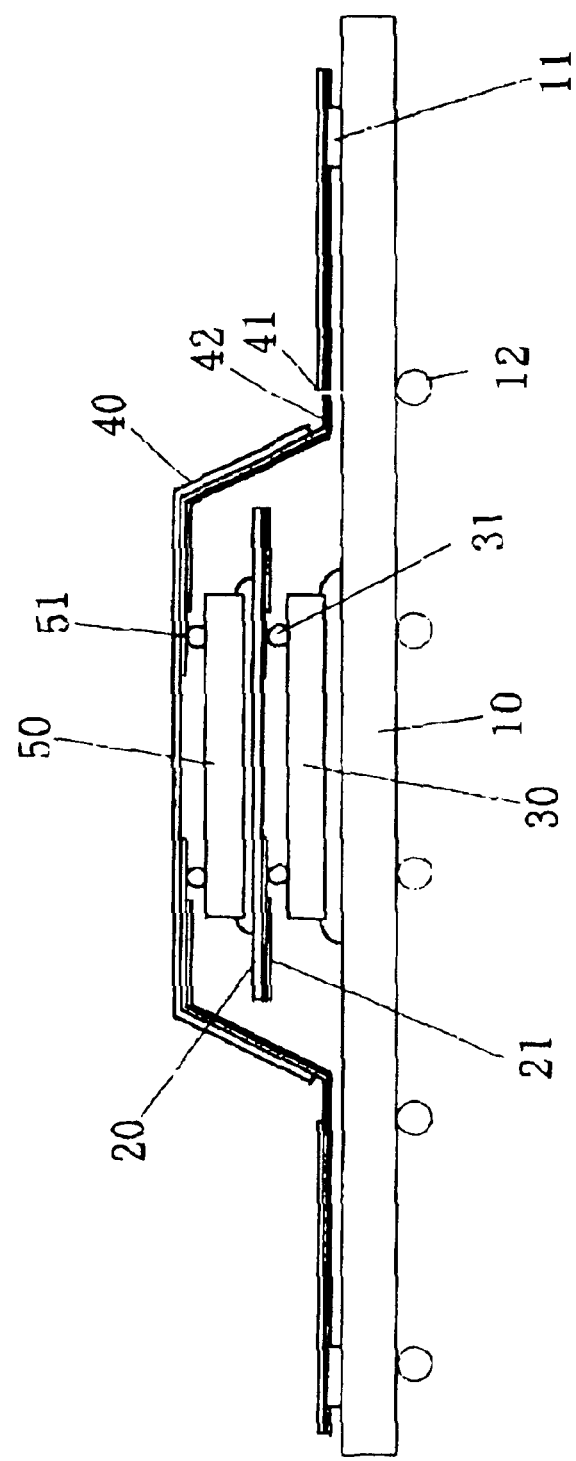
FIG. 2 shows a cross-sectional view taken along lines a—a of FIG. 1.
Figure 3:
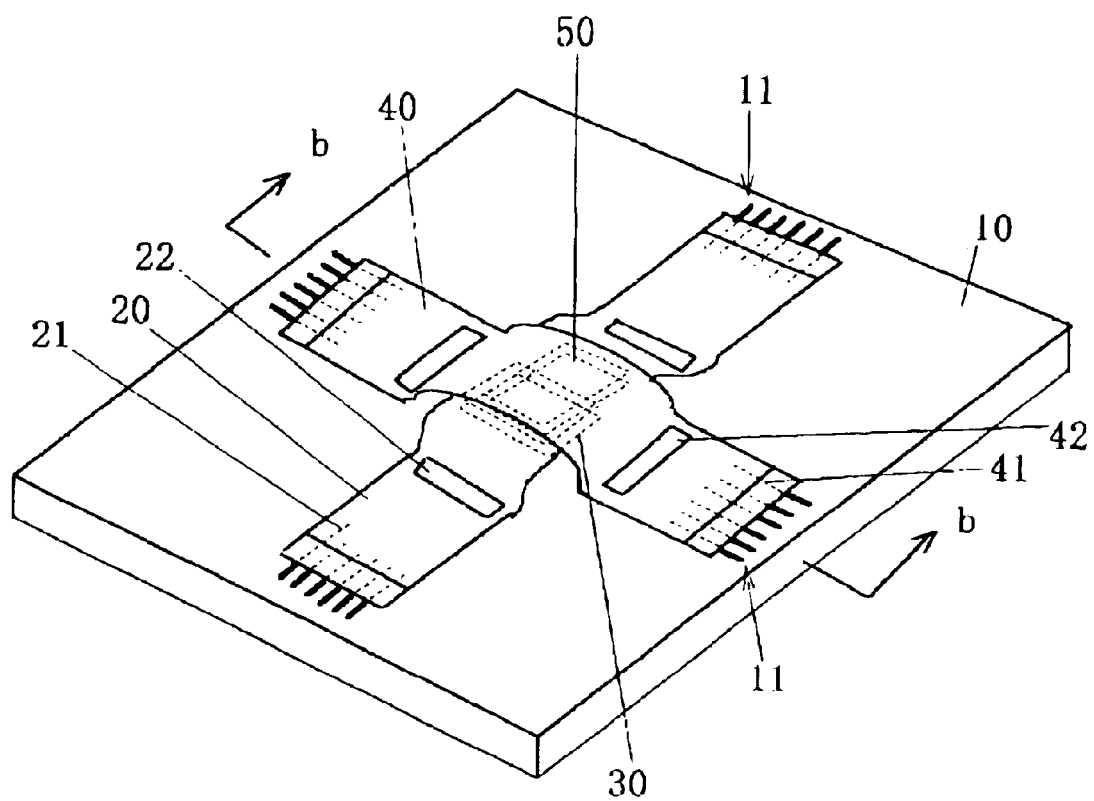
FIG. 3 shows a semiconductor device with a different structure in accordance with another embodiment of the present invention.
Figure 4:
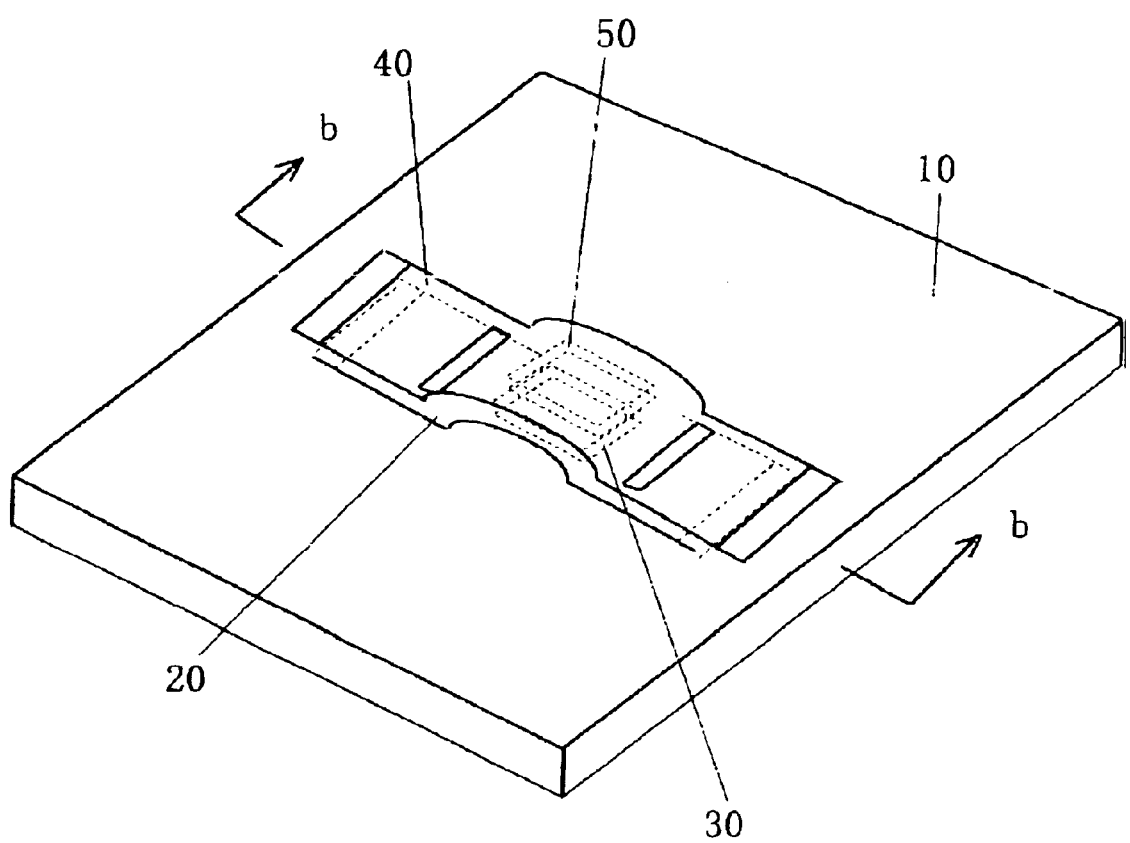
FIG. 4 shows a semiconductor device with a different structure in accordance with another embodiment of the present invention.
Figure 5:
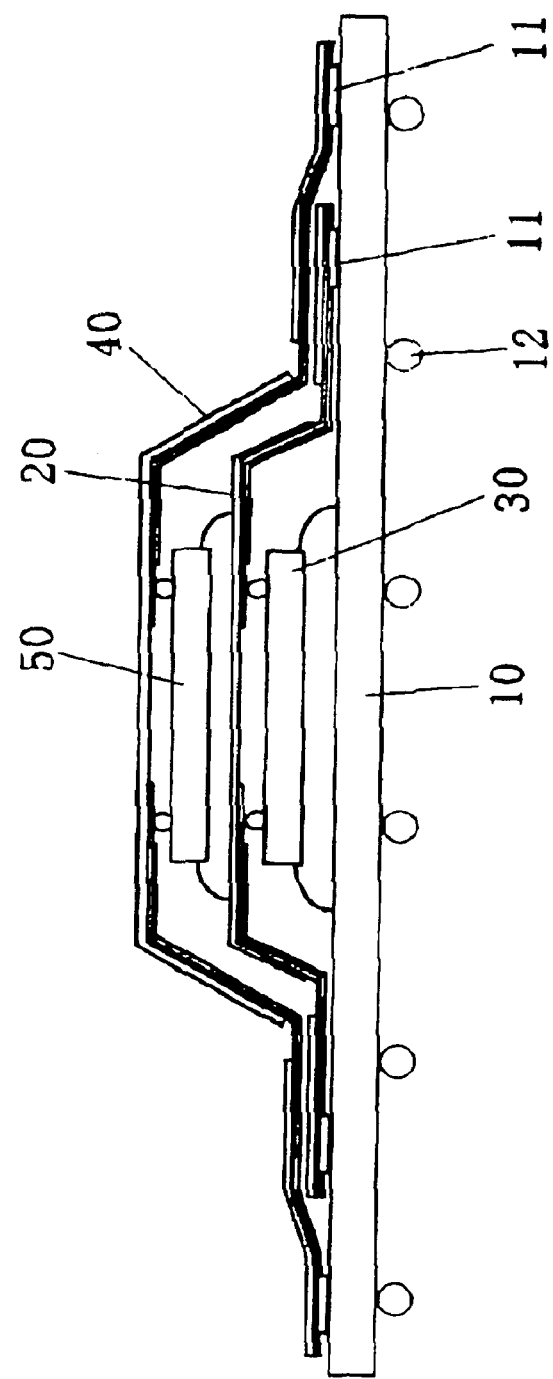
FIG. 5 shows a cross-sectional view taken along lines b—b of FIG. 4.

FIG. 1 shows a diagram of a semiconductor device in accordance with one embodiment of the present invention, FIG. 2 shows a cross-sectional view taken along lines a—a of FIG. 1. FIGS. 3 and 4 show semiconductor devices with different structures in accordance with other embodiments of the present invention. FIG. 5 shows a cross-sectional view taken along lines b—b of FIG. 4.

A semiconductor device shown in FIG. 1 is equipped with a base substrate 10, a flexible substrate 20 which is a first substrate, a first semiconductor element 30, a flexible substrate 40 which is a second substrate, and a second semiconductor element 50.

The base substrate 10 may be a flexible substrate or a rigid substrate. The base substrate 10 has a dielectric layer having two opposing main surfaces, and a base wiring 11 provided on at least one of the main surfaces of the dielectric layer. The dielectric layer may include a glass epoxy material, a polyimide material, a polyethylene terephthalate material, or the like. The base substrate 10 may include a multiple layered wiring substrate in which the base wiring 11 is also provided inside the dielectric layer. Also, the base substrate 10 may include a two-surface wiring substrate in which the base wiring 11 is also provided on the other main surface of the dielectric layer. The base wiring 11 provided on the surface of the dielectric layer may be covered by a dielectric film (protection film) that protects the base wiring 11. In this case, the base wiring 11 may be exposed through the dielectric film at least at junction sections between the first wiring 22 and the second wiring 41 to be described below. The dielectric film may include a glass epoxy material, a polyimide material, a polyethylene terephthalate material, or the like.

Also, the base substrate 10, as indicated in FIG. 2 or FIG. 5, may have external terminals 12 to be electrically connected to the base wiring 11 on the other main surface. The external terminals 12 may be, as shown in the figure, protruded electrodes such as solder balls, pins or leads. Above the base substrate 10 are provided a flexible substrate 20, a first semiconductor element 30 mounted on the flexible substrate 20, a flexible substrate 40 provided above the flexible substrate 20, and a second semiconductor element 50 mounted on the flexible substrate 40. Furthermore, above the flexible substrate 40 may be provided another substrate to be connected to the base substrate 10, and another semiconductor element mounted on that substrate. In other words, a plurality of semiconductor packages each including a substrate and a semiconductor element mounted on the substrate may be stacked in layers above the base substrate 10.

The flexible substrate 20 has a dielectric layer having two opposing main surfaces, and a first wiring 21 provided on at least one of the main surfaces of the dielectric layer. The flexible substrate 40 has a dielectric layer having two opposing main surfaces, and a second wiring 41 provided on at least one of the main surfaces of the dielectric layer. The dielectric layer of the flexible substrate 20 and the dielectric layer of the flexible substrate 40 may be formed from the same material, or different material. For example, a material having a flexibility such as a polyimide material or a polyethylene terephthalate material may be used as the material of the dielectric layers. The first wiring 21 and the second wiring 41 may be formed from the same material, or may be formed from different materials. In other words, the flexible substrate 20 and the flexible substrate 40 may be formed from substrates having the same structure, or may be formed from substrates having different structures. The first wiring 21 and the second wiring 41 may be formed from a plurality of metal layers, respectively, or may be formed from a single metal layer. As for the flexible substrate 20 and the flexible substrate 40, the main surface of the flexible substrate 20 may have generally the same area as the main surface of the flexible substrate, or the main surface of the flexible substrate 20 may have a smaller area or a greater area than the main surface of the flexible substrate 40.

When the main surface of the flexible substrate 20 has a smaller area than the main surface of the flexible substrate 40, and the structure indicated in FIG. 5 is applied, connecting sections between the second wiring 41 and the base wiring 11 can be provided outside the overlapping region between the flexible substrate 40 and the flexible substrate 20, which makes it easier to connect the second wiring 41 and the base wiring 11. Each of the flexible substrate 20 and the flexible substrate 40 may include a multiple wiring layer substrate in which each of the first wiring 21 and the second wiring 41 is also provided inside the dielectric layer, respectively. The first wiring 21 and the second wiring 41 provided on the main surface of the dielectric layer may be covered by dielectric films (protection films) that protect the wirings. In this case, the first wiring 21 and the second wiring 41 may be exposed through the dielectric films at junction sections with the base wiring 11, to be described below. The dielectric film may include a flexible resin such as a polyimide material, a polyethylene terephthalate material or the like.

The semiconductor element 30 includes an integrated circuit on the inside. The semiconductor element 30 has on its main surface first electrodes 31 that are electrically connected to the integrated circuit. The first electrodes 31 may include electrode pads that electrically connect at least to the integrated circuit, and protruded electrodes formed in the shape of bumps on the electrode pads. Similarly, the semiconductor element 50 may also include an integrated circuit, and has on its main surface second electrodes 51 that are electrically connected to the integrated circuit. The second electrodes 51 may also include electrode pads that electrically connect to the integrated circuit, and may further include protruded electrodes formed in the shape of bumps on the electrode pads. The semiconductor elements 30 and 50 are mounted, as indicated in FIGS. 2–5, on surfaces of the flexible substrates 20 and 40, respectively, which oppose the surface of the base substrate 10. The first and second electrodes 31 and 51 of the first and second semiconductor elements 30 and 50 are electrically connected to the first and second wirings 21 and 41 of the flexible substrates 20 and 40, respectively. The first electrodes 31 and the first wiring 21 may be connected by flip-chip bonding, using the protruded electrodes such as solder bumps as illustrated, or may be connected by wire bonding. By using the flip-chip bonding method, wires do not contact the semiconductor element even when the gap between the substrates is narrowed, and therefore connection failures are difficult to occur. For this reason, connection failures can be reduced, and the semiconductor device can be made smaller.

Also, the first semiconductor element 30 may be fixed to the base substrate 10 with a resin. The second semiconductor element 50 may be fixed to the flexible substrate 20 with a resin. By so doing, damages that may be inflicted on the first and second semiconductor elements 30 and 50 may be alleviated. The resin may be dielectric resin. In this case, the insulation between each of the substrates and the first and second semiconductor elements 30 and 50 can be improved. Also, a conductive resin may be used. In this case, the heat radiation property of the first and second semiconductor elements 30 and 50 improves. The first wiring 21 and the second wiring 41 of the flexible substrates 20 and 40 are connected to the base wiring 11 of the base substrate 10. The first wiring 21 and the second wiring 41 may be bonded to the base wiring 11. The base wiring 11 and the first wiring 21 or the second wiring 41 may be bonded together by a known adhesive bonding method using an anisotropic conductive adhesive, or a dielectric or conductive adhesive, or may be bonded together by a known metal bonding method such as a solder bonding, an alloy bonding, a gold bump bonding or the like. At least portions of the main surface of the base substrate 10 and the main surfaces of the flexible substrates 20 and 40 may contact one another. The base wiring 11, the first wiring 21 and the second wiring 41 may be formed with protruded sections at connecting sections between the base wiring 11 and the first wiring 21 or the second wiring 41. In this case, by forming the protruded sections, the base wiring 11 and the first wiring 21 or the second wiring 41 can be readily bonded even when the surfaces of the wirings are covered by thick dielectric films or the like. The protruded sections may be formed, at connecting sections with the base wiring 11, by bending the first wiring 21 and the second wiring 41 to provide bent sections that protrude from the substrate surface, or may be formed by providing step differences in the surfaces of the first wiring 21 and the second wiring 41, or may be formed by providing separate conductive members in a convex shape on the surface of the first wiring 21 and the second wiring 41. When the bent sections are provided, a resin may be filled in concave sections of the bent sections. By so doing, the stress applied to the bent sections may be alleviated.

Also, each of the main surfaces of the flexible substrates 20 and 40 which oppose the surface of the base substrate 10 may be in a rectangular shape. In this case, each of the main surfaces of the flexible substrates 20 and 40 is surrounded by long sides and short sides that are shorter than the long sides. The short sides intersect the long sides. In this case, as indicated in FIGS. 1–3, the flexible substrates 20 and 40 may be mounted on the base substrate 10 such that the flexible substrates 20 and 40 mutually intersect. In other words, when the long sides of the flexible substrates 20 and 40 are projected onto the base substrate 10, the flexible substrates 20 and 40 may be disposed in a manner that the long sides of the flexible substrate 20 and the long sides of the flexible substrate 40 mutually intersect. The flexible substrate 20 includes a first region where the first semiconductor element 30 is mounted and a second region where a portion of the first wiring 21 that is connected to the base wiring 11 is located. Cut out opening sections 22 may be provided between the first region and the second region in a manner to expose at least one part of the first wiring 21. In this case, the flexible substrate 20 may be bent at the opening sections 22 as base points. Also, the flexible substrate 40 includes a third region where the semiconductor element 50 is mounted and a fourth region where a portion of the second wiring 41 that is connected to the base wiring 11 is located. Cut out opening sections 42 may be provided between the third region and the fourth region in a manner to expose at least one part of the second wiring 41.

In this case, the flexible substrate 40 may be bent at the opening sections 42 as base points. By providing such opening sections 22 and 42, the flexible substrate 20 or the flexible substrate 40 can be readily bent at the sections where the opening sections 22 and 42 are provided. This makes it easy for the flexible substrates 20 and 40 to maintain the bent state. Accordingly, stresses that are generated between the base wiring 11 and the first and second wirings 21 and 41 can be reduced, and therefore their connection reliability can be improved. Each of the surfaces of the first and second semiconductor elements 30 and 50 having the first and second electrodes 31 and 51 can be in a rectangular shape. In this case, each of the surfaces having the first and second electrodes 31 and 51 is surrounded by long sides and short sides that are shorter than the long sides, wherein the short sides intersect the long sides. In this case, as indicated in FIGS. 1 and 3, the first semiconductor element 30 may be mounted such that its long sides are perpendicular to, intersect, or in parallel with the lengthwise direction of the flexible substrate 20.

The outer configuration of the second semiconductor element 50 may also be rectangular. In this case also, the main surface of the second semiconductor element 50 includes long sides and short sides that are shorter than the long sides and intersect the long sides. As indicated in FIGS. 1 and 3, the semiconductor element 50 may be mounted such that its long sides are perpendicular to, intersect, or in parallel with the lengthwise direction of the flexible substrate 40. The flexible substrate 20 and the flexible substrate 40 may be disposed such that the long sides of the first semiconductor element 30 and the long side of the second semiconductor element 50 are in parallel with each other. By disposing them in this manner, even when flexible substrates are used as the substrates, the first and second semiconductor elements 30 and 50 serve as supporting members for the flexible substrates in the respective mounting regions, and impacts that may be applied to the first and second semiconductor elements 30 and 50 can be alleviated.

Further, the flexible substrate 20 and the flexible substrate 40 may be disposed such that, when the long sides of the first semiconductor element 30 and the long sides of the second semiconductor element 50 are projected onto the base substrate 10, the long sides of the first semiconductor element 30 and the long sides of the second semiconductor element 50 intersect each other, as indicated in FIG. 3. In this case, they may be disposed such that the long sides of the first semiconductor element 30 and the long sides of the second semiconductor element 50 are perpendicular to each other. By disposing them in this manner, the degree of freedom in designing the base wiring 11, and the first and second wirings 21 and 41 becomes greater.

Next, a method for manufacturing such a semiconductor device will be described.

First, the first electrodes 31 provided on the first semiconductor element 30 are electrically connected to the first wiring 21 of the flexible substrate 20 by flip-chip bonding or wiring bonding, as described above. Similarly, the second electrodes 51 provided on the second semiconductor element 50 are electrically connected to the second wiring 41 of the flexible substrate 40 by thermal bonding or the like. Then, the second semiconductor element 50 and the flexible substrate 20 may be fixed with a resin such as an adhesive. By so doing, positioning of the flexible substrates 20 and 40 with respect to the base substrate 10 becomes easier. Next, the flexible substrate 20 is disposed on the base substrate 10 with the surface side of the flexible substrate 20 on which the first semiconductor element 30 is mounted being opposed to the base substrate 10, the flexible substrate 20 is bent, and the base wiring 11 and the first wiring 21 are electrically connected to each other. The flexible substrate 20 may be bent at the opening sections 22 as base points as described above. Similarly, the flexible substrate 40 is disposed above the flexible substrate 20 with the surface side of the flexible substrate 40 on which the second semiconductor element 50 is mounted being opposed to the flexible substrate 20, the flexible substrate 40 is bent, and the base wiring 11 and the second wiring 41 are joined to each other.

In this instance, as indicated in FIG. 2 and FIG. 3, the flexible substrate 20 and the flexible substrate 40 may be disposed such that the long sides of the flexible substrate 20 and the long sides of the flexible substrate 40, as projected onto the base substrate 10, intersect each other. Also, as indicated in FIG. 4, the flexible substrate 20 and the flexible substrate 40 may be disposed such that the long sides of the flexible substrate 20 and the long sides of the flexible substrate 40, as projected onto the base substrate 10, are in parallel with each other. The flexible substrate 40 may be bent at the opening sections 42 as base points as described above. When the first and second wirings 21 and 41 are electrically connected to the base wiring 11, the connection methods described above can be used.

In this manner, the present embodiment is equipped with the base substrate 10 provided with the base wiring 11. The flexible substrate 20 includes the first wiring 21 to be electrically connected to the base wiring 11 and is provided above the base substrate 10. The first semiconductor element 30 includes the first electrodes 31 to be electrically connected to the first wiring 21 and is provided between the base substrate 10 and the flexible substrate 20. The flexible substrate 40 includes the second wiring 41 to be electrically connected to the base wiring 11 and is provided above the flexible substrate 20. The second semiconductor element 50 includes the second electrodes 51 to be electrically connected to the second wiring 41 and is provided between the flexible substrate 20 and the flexible substrate 40 and above the first semiconductor element 30. The flexible substrate 20 has the first region where the first semiconductor element 30 is provided below, the second region where a portion of the first wiring 21 that connects to the base wiring 11 is located, and the opening sections 22 between the first region and the second region. The flexible substrate 40 has the third region where the second semiconductor element 50 is provided below, the fourth region where a portion of the second wiring that connects to the base wiring is located, and the opening sections 42 between the third region and the fourth region. As a result, even when the first and second semiconductor elements 30 and 50 are stacked in multiple layers on the base substrate 10, the package size can be made smaller because the thickness of the flexible substrates 20 and 40 is small.

Also, since independent through holes for chip selectors are not required like the conventional art, and an additional carrier substrate therefore is not required, and thus the carrier substrate to be stacked does not need to be connected by connecting members, the package size can be made smaller. Also, in the present embodiments, the cut out opening sections 22 and 42 are provided in the flexible substrates 20 and 40 in areas between the sections where the semiconductor elements 30 and 50 are mounted and areas where the flexible substrates 20 and 40 are connected to the base wiring 11 in a manner to expose the first and second wirings 21 and 41, and the flexible substrates 20 and 40 are bent at the opening sections 22 and 42 as base points. As a result, the flexible substrates 20 and 40 can be readily bent, and the connecting state between the base wiring 11 and the first and second wirings 21 and 41 can be maintained in good condition.

Also, in accordance with the present embodiments, there are no restrictions on the mounting configurations of the first and second semiconductor elements 30 and 50 with respect to the flexible substrates 20 and 40. The first and second semiconductor elements 30 and 50 can be mounted so as to be in parallel with each other, as indicated in FIGS. 1 and 4, or the first and second semiconductor elements 30 and 50 can be mounted so as to be perpendicular to each other, as indicated in FIG. 3. Also, the semiconductor device having the external terminals 12 in accordance with the present invention may be mounted on a circuit substrate having wirings with the external terminals 12 being electrically connected to the wirings. This substrate may be mounted on an electronic equipment such as a portable telephone, a digital camera or the like. As a result, even when packages that may be mounted on the electronic equipment increase with an increase in its performance, the electronic equipment can be made thinner and smaller.

As described above, the semiconductor devices, method for manufacturing the semiconductor devices, and electronic equipment in accordance with the present invention are each equipped with a base substrate provided with a base wiring. A first substrate includes a first wiring to be electrically connected to the base wiring and is provided above the base substrate. A first semiconductor element includes a first electrode to be electrically connected to the first wiring and is provided between the base substrate and the first substrate. A second substrate includes a second wiring to be electrically connected to the base wiring and is provided above the first substrate. A second semiconductor element includes a second electrode to be electrically connected to the second wiring and is provided between the first substrate and the second substrate and above the first semiconductor element. The first substrate has a first region where the first semiconductor element is provided below, a second region where a portion of the first wiring that connects to the base wiring is located, and a first bent section between the first region and the second region. The second substrate has a third region where the second semiconductor element is provided below, a fourth region where a portion of the second wiring that connects to the base wiring is located, and a second bent section between the third region and the fourth region. As a result, the semiconductor package size can be made smaller.

What is claimed is:

1. A semiconductor device comprising:
   a base substrate provided with a base wiring;
   a first substrate that extends from a first side of the base substrate to a second side of the base substrate and includes a first wiring to be electrically connected to the base wiring on both the first and second sides of the base substrate, wherein the first substrate is provided above the base substrate;
   a first semiconductor element that is provided between the base substrate and the first substrate;
   a second substrate that extends from a third side of the base substrate to a fourth side of the base substrate and includes a second wiring to be electrically connected to the base wiring on both the third and fourth sides of the base substrate, wherein the second substrate is provided above the first substrate; and
   a second semiconductor element that is provided between the first substrate and the second substrate and above the first semiconductor element,
   wherein the first substrate has a first region where the first semiconductor element is provided below, second regions where portions of the first wiring that connect to the base wiring are located, and first bent sections between the first region and the second regions, and
   the second substrate has a third region where the second semiconductor element is provided below, fourth regions where portions of the second wiring that connect to the base wiring are located, and second bent sections between the third region and the fourth regions.

2. The semiconductor device according to claim 1, further comprising:
   a first electrode that is provided on the first semiconductor element; and
   a second electrode that is provided on the second semiconductor element,
   wherein the first electrode is electrically connected to the first wiring, and
   the second electrode is electrically, connected to the second wiring.

3. The semiconductor device according to claim 2, further comprising:
   a surface of the first semiconductor element that includes the first electrode has a rectangular shape including a first side and a second side that is longer than the first side and intersects the first side; and
   a surface of the second semiconductor element that includes the second electrode has a rectangular shape including a third side and a fourth side that is longer than the third side and intersects the third side wherein the first semiconductor element and the second semiconductor element are disposed such that the second side and the fourth side are in parallel with each other.

4. The semiconductor device acceding to claim 2, further comprising:

a surface of the first semiconductor element that includes the first electrode has a rectangular shape including a first side and a second side that is longer than the first side and intersects the first side; and a surface of the second semiconductor element that includes the second electrode has a rectangular shape including a third side and a fourth side that is longer than the third side and intersects the third side, wherein the first semiconductor element and the second semiconductor element are disposed such that the second side and the fourth side projected onto the base substrate intersect each other.

5. The semiconductor device according to claim 1, further comprising:

a surface of the first substrate that opposes a surface of the base substrate has, when viewed from above, a rectangular shape including a first side and a second side that is longer than the first side and intersects the first side; and a surface of the second substrate that opposes surface of the base substrate has, when viewed from above, a rectangular shape including a third side and a fourth side that is longer than the third side and intersects the third side, wherein the first substrate and the second substrate are disposed such that the second side and the fourth side projected onto the base substrate intersect each other.

6. The semiconductor device according to claim 1, wherein opening sections are formed in the first substrate at the first bent sections.

7. The semiconductor device according to claim 1 wherein opening sections are formed in the second substrate at the second bent sections.

* * * * *